United States Patent
Link et al.

(10) Patent No.: US 9,837,214 B2
(45) Date of Patent: Dec. 5, 2017

(54) CAPACITOR HAVING AN IMPROVED LINEAR BEHAVIOR

(71) Applicant: Snaptrack Inc., San Diego, CA (US)

(72) Inventors: Andreas Link, Laaber (DE); Thomas Metzger, Munich (DE); Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 182 days.

(21) Appl. No.: 14/424,989

(22) PCT Filed: Aug. 1, 2013

(86) PCT No.: PCT/EP2013/066212
§ 371 (c)(1),
(2) Date: Feb. 27, 2015

(87) PCT Pub. No.: WO2014/032907
PCT Pub. Date: Mar. 6, 2014

(65) Prior Publication Data
US 2015/0221442 A1    Aug. 6, 2015

(30) Foreign Application Priority Data

Aug. 30, 2012 (DE) .................. 10 2012 108 035

(51) Int. Cl.
*H01G 4/35* (2006.01)
*H01G 4/005* (2006.01)
(Continued)

(52) U.S. Cl.
CPC ............... *H01G 4/35* (2013.01); *H01G 4/005* (2013.01); *H01G 4/30* (2013.01); *H01G 4/38* (2013.01);
(Continued)

(58) Field of Classification Search
CPC ............ H01G 4/005; H01G 4/30; H01G 4/35; H01G 4/38; H01G 4/40; H01G 17/00;
(Continued)

(56) References Cited

U.S. PATENT DOCUMENTS

| 5,576,926 A | 11/1996 | Monsorno |
| 6,226,170 B1 | 5/2001 | Nellissen et al. |

(Continued)

FOREIGN PATENT DOCUMENTS

| DE | 10246791 A1 | 4/2004 |
| DE | 102008045346 A1 | 3/2010 |

(Continued)

OTHER PUBLICATIONS

International Search Report and Written Opinion—PCT/EP2013/066212—ISA/EPO—Nov. 22, 2013.

*Primary Examiner* — Thienvu Tran
*Assistant Examiner* — Kevin J Comber
(74) *Attorney, Agent, or Firm* — Patterson & Sheridan, L.L.P.

(57) ABSTRACT

A capacitor having improved linear properties is provided. The capacitor is compatible with manufacturing processes of components which function using BAW. The capacitor comprises a first and a second electrode (E1, E2) in a first electrically conductive layer and a third electrode (E3) in a second electric layer. A dielectric layer (DL) is arranged between the electrically conductive layers. The first electrode (E1) and the second electrode (E2) are the terminal electrodes of the capacitor.

12 Claims, 11 Drawing Sheets

(51) Int. Cl.
*H01G 4/30* (2006.01)
*H01G 4/40* (2006.01)
*H01G 4/38* (2006.01)
*H01G 17/00* (2006.01)
*H03H 9/05* (2006.01)

(52) U.S. Cl.
CPC ............... *H01G 4/40* (2013.01); *H01G 17/00* (2013.01); *H03H 9/0542* (2013.01); *H03H 9/0547* (2013.01); *H03H 9/0561* (2013.01)

(58) Field of Classification Search
CPC ... H03H 9/0542; H03H 9/0547; H03H 9/0561
USPC ....................................................... 361/270
See application file for complete search history.

(56) References Cited

U.S. PATENT DOCUMENTS

| | | |
|---|---|---|
| 6,337,790 B1 | 1/2002 | Nellissen et al. |
| 7,554,244 B1 | 6/2009 | Ballato |
| 2006/0164183 A1 | 7/2006 | Tikka et al. |
| 2007/0058326 A1 | 3/2007 | Hidaka et al. |
| 2007/0253143 A1 | 11/2007 | Goldberger et al. |
| 2009/0002095 A1* | 1/2009 | Terada ................... H03H 9/725 333/133 |
| 2011/0187478 A1* | 8/2011 | Link ....................... H03H 9/547 333/133 |
| 2011/0266917 A1* | 11/2011 | Metzger ................. H03H 3/02 310/313 A |
| 2011/0316649 A1 | 12/2011 | Link et al. |

FOREIGN PATENT DOCUMENTS

| | | |
|---|---|---|
| DE | 102009011639 A1 | 9/2010 |
| JP | H02303091 A | 12/1990 |
| JP | 2001291638 A | 10/2001 |
| JP | 2002505812 A | 2/2002 |
| JP | 2002524767 A | 8/2002 |
| JP | 2002524867 A | 8/2002 |
| JP | 2006502634 A | 1/2006 |
| JP | 2012519447 A | 8/2012 |

* cited by examiner

CAPACITOR HAVING AN IMPROVED LINEAR BEHAVIOR

The present invention relates to capacitors having an improved linear behavior, for example, for high-frequency (HF) circuits.

Capacitors are the real implementations of ideal capacitive elements. In network theory, capacitive elements are therefore characterized solely by their capacitance, while capacitors, in addition to their capacitive behavior, also generally have undesirable frequency and temperature dependencies, parasitic inductances, and a nonlinear behavior.

The occurrence of undesirable IMD (intermodulation distortion) products is possible particularly in HF circuits, as, for example, may be used in mobile communication devices. Current cellular network systems are placing ever-greater demands on all components in their transceivers, and thus on their capacitors as well. In particular, a nonlinear behavior of components, which in practice results in the generation of harmonic and intermodulation products in the signal path, may sharply reduce the sensitivity of the receiver side.

Mobile communication devices may, for example, comprise filter components which function using acoustic waves, for example, using bulk acoustic waves. Corresponding filter circuits may therefore include capacitors whose electromagnetic properties should correspond to those of ideal capacitive elements.

For example, DE 10 2008 045 346 A1 describes duplexer circuits of mobile communication devices containing HF filters.

From DE 10 2009 011 639 A1, it is known to integrate capacitors into components which function using bulk acoustic waves in order to obtain a component having small dimensions and good electrical properties.

The problem with known capacitors for HF filters is the aforementioned undesirable properties of real capacitors.

One object of the present invention is therefore to provide capacitors which are suitable for use in HF filter circuits and have an electrical behavior which comes as close as possible to that of ideal capacitive elements and in particular have an improved linear behavior. Furthermore, such capacitors are to cause no parasitic resonances if they, for example, are implemented in components which function using bulk acoustic waves. Additionally, corresponding capacitors are to be producible in an economical manner and without increasing the manufacturing complexity. Furthermore, a corresponding component including such a capacitor is to be compatible with the continuing trend toward miniaturization.

These objects are achieved via a capacitor according to claim 1. Dependent claims provide advantageous embodiments of the present invention. The features described in the claims and hereinafter may interact in any combination in order to produce an individually matched capacitor.

A capacitor comprises a first and a second electrically conductive layer. The capacitor furthermore comprises a first and a second electrode structured in the first layer and a third electrode structured in the second layer. A dielectric layer is arranged between the electrically conductive layers. A portion of the first electrode and a portion of the second electrode each overlap with at least a portion of the third electrode. The first electrode and the second electrode are the terminal electrodes of the capacitor.

The term "overlap" refers to the fact that corresponding areas of the electrodes are arranged lying flat facing each other. At least the overlapping parts of the electrodes each essentially implement a plate capacitor.

The capacitor is connectable to a circuit environment via the terminal electrodes of the capacitor, i.e., via the first electrode and the second electrode.

It is possible that the first electrode and the third electrode together form a first partial capacitor, while the third electrode and the second electrode form a second partial capacitor. The capacitor is then essentially the series connection of both partial capacitors.

The capacitor thus has a layer structure which is compatible with manufacturing processes of components functioning using acoustic waves, for example, bulk acoustic waves.

It is possible to obtain good electrical properties of the capacitor via a suitable choice of the materials of the layers. In particular, the choice of the material of the dielectric layer has a strong influence on the linear properties of the capacitor.

In one specific embodiment, the dielectric layer is not piezoelectric. The material of the dielectric layer thus differs substantially from the material of a piezoelectric layer of components which function using bulk acoustic waves.

Components which function using bulk acoustic waves comprise a piezoelectric layer between two electrodes. A layer stack made up of a lower electrode, a piezoelectric layer, and an upper electrode is electroacoustically active if an HF signal is applied to these electrodes having the resonance frequency of the layer stack. In such a layer stack, an acoustic resonance then develops. Thus, an electroacoustic resonator exists which manifests a highly nonlinear behavior. If a capacitor is to be obtained instead of a so-called BAW (bulk acoustic wave) resonator, it is thus possible to detune a corresponding layer stack via mechanical properties such as the deposition of layers detuning the resonator on the surface of the upper electrode. However, an ideal capacitive element is not achieved in doing so.

There are BAW resonators in which an acoustic mirror is arranged which supports the development of acoustic resonances. Such a mirror may comprise a series of layers of materials having alternately high acoustic impedance and low acoustic impedance. Materials having high acoustic impedance are in particular materials having a high specific density, for example, metals. The use of a capacitor whose dielectric is not the piezoelectric layer of a BAW resonator stack, but which uses a material of the mirror as the dielectric, is possible, but highly complex, since the corresponding electrodes, in particular the lower electrode, are buried deep in the layer stack, and a via extending relatively deeply through 1. the layer having the piezoelectric material,
2. the layer having the lower electrode of the BAW resonator, and
3. the layer having the dielectric material of the capacitor arranged below the lower electrode of the BAW resonator is necessary.

The present invention now provides a capacitor in which no via through the layer having the dielectric material beneath the layer having the piezoelectric material is necessary. Thus, a capacitor is provided whose electrodes may be easily contacted. As a result of the dielectric material not being piezoelectric, excellent electrical, in particular linear, properties are obtained.

In one specific embodiment, the dielectric layer of the capacitor is correspondingly a mirror layer of a component which functions using acoustic waves, for example, using bulk acoustic waves.

In one specific embodiment, the first electrically conductive layer is a layer in which electrodes of a resonator which functions using bulk acoustic waves are arranged. In particular, it is possible that the first electrically conductive layer comprises an electrode of a resonator which functions using bulk acoustic waves.

In one specific embodiment, the first electrode is an electrode of a resonator which functions using bulk acoustic waves. At least one of the partial capacitors is correspondingly arranged below a BAW resonator stack. Since the first electrode is an electrode of a BAW resonator, electrical access to the first electrode is easily possible. In such a case, another via through the layer having the piezoelectric material would at most be necessary in order to reach and contact the second electrode.

In one specific embodiment, the capacitor correspondingly comprises a piezoelectric layer above the first electrically conductive layer and an additional electrically conductive layer above the piezoelectric layer. In the additional electric layer above the piezoelectric layer, the upper electrodes may be structured from BAW resonator stacks. If a via through the layer having the dielectric material above the second electrode is present, structured material of the additional electrically conductive layer may thus establish a connection to the second electrode.

Thus, a capacitor is obtained which may be formed essentially without additional manufacturing processes. In particular, no via through the dielectric material of the capacitor is necessary.

In one specific embodiment, one of the two electrodes which is selected from a first and a second electrode is correspondingly electrically connected to an HF filter circuit by means of a via through the piezoelectric layer.

In one specific embodiment, at least one of the two electrodes, selected from a first and a second electrode, is arranged beneath a bump connection and is electrically connected to the bump connection.

BAW resonator stacks, in particular having acoustic mirrors, are arranged on a carrier substrate and are part of a BAW chip. Such a chip having a flip-chip construction may be electrically connected to and linked with other circuit components or corresponding components (i.e., via bump connections). In order for the bump connections not to disturb the electroacoustic resonators, they are not arranged on the BAW resonators, but rather next to the BAW resonators. In order to obtain low-height components, the bump connections may be arranged in recesses in the layer having the piezoelectric material. In such a case, the recess in the piezoelectric material may thus constitute a via up to the first or second electrode of the capacitor.

A so-called UBM (under-bump metallization) may be arranged between one of the electrodes of the capacitor and a bump connection in order to obtain a good electrical and mechanical connection of the bump connection.

In one specific embodiment, the capacitor is part of an HF filter circuit. In particular, transmission and/or reception filters of duplexer circuits for mobile communication devices are possible as filter circuits. Particularly great demands with respect to linearity are placed in particular on capacitors electrically connected to an antenna path, in order to keep the development of intermodulation products and harmonics as low as possible. The use of a capacitor according to the present invention near an antenna path in terms of circuitry is therefore especially advantageous.

It is thus possible to connect a corresponding capacitor in an impedance matching circuit of a duplexer.

In one specific embodiment, the capacitor is part of an absorption circuit of an HF filter circuit. Via such an absorption circuit, undesirable frequency components which would generate intermodulation products having particularly disturbing frequency components may be discharged to ground.

In one specific embodiment, the capacitor is part of a rejection circuit of an HF filter circuit.

In one specific embodiment, the capacitor is electrically connected in parallel with an inductive element of an HF filter circuit. When matching the impedance to inductive elements electrically connected in parallel at a filter port, small inductance values cause long lines in the Smith chart. For the most part, due to lack of space, it is not possible to introduce an inductive element having a larger inductance in the housing for obtaining short lines in the Smith chart. Furthermore, there are application cases in which an inductive element electrically connected in series is not an option. In such a case, a corresponding capacitor in a parallel branch may compensate for the effect of a small parallel inductance, so that an inductive element having large geometric dimensions may correspondingly be made smaller or even be omitted entirely.

In one specific embodiment, the capacitor is part of a duplexer matching circuit including a π-element or including a T-element.

π-elements and T-elements are highly suitable for impedance matching, for example, between a transmission filter and a reception filter of a duplexer, since such duplexer matching circuits are generally electrically connected directly to the antenna path.

In one specific embodiment, the capacitor is coupled directly, or indirectly via other circuit elements, to a resonator which functions using acoustic waves which is not arranged directly adjacent, the resonator which functions using bulk acoustic waves resonator not being arranged directly adjacent to the capacitor. A connection of a corresponding capacitor to a BAW resonator is thus also possible if too little space is available in the immediate vicinity of the BAW resonator or if acoustic waves emitted by the resonator would disturb the functioning of the capacitor.

In one specific embodiment, the capacitor comprises a series circuit made up of two, four, six, eight, ten, or more partial capacitors. In this case, it is not necessary for the third electrode to overlap with both the first electrode and the second electrode. It is possible that the first electrode overlaps with an electrode of the second electrically conductive layer. This electrode of the second electrically conductive layer overlaps with another electrode of the first electrically conductive layer, which in turn overlaps with another electrode of the second electrically conductive layer. Thus, an interlinking of partial capacitors from the first electrode to the second electrode via a corresponding number of intermediate electrodes is obtained.

In one specific embodiment of the capacitor, the dielectric layer is locally thinned in the area of at least one electrode. The thickness of the dielectric layer may be reduced in comparison to the thickness of the dielectric material of the corresponding mirror layer of a BAW capacitor.

The materials of the first and second electrically conductive layers and the dielectric layer may comprise the materials of conventional BAW resonator stacks. Thus, aluminum, copper, gold, and silver as metals having high electrical conductivity, or alloys made up of these metals, are possible. The electrically conductive layers may also comprise titanium, for example, as an adhesion-promoting layer. In particular, it is possible that the electrically conductive layers in turn are themselves made up of a plurality of layers including various metals or alloys.

The dielectric layer may in particular comprise nonconductive materials having high or low acoustic impedance, for example $SiO_2$, $Si_3N_4$ and/or $Ta_2O_5$. The dielectric layer may also comprise multiple partial layers.

The inverse capacitance of a series connection of partial capacitors is essentially the sum of the inverse capacitances of the corresponding partial capacitors. In order to obtain a capacitance per required area which is as large as possible, the partial capacitors i.e., their overlap areas, are essentially equal in size.

Furthermore, the capacitance of the partial capacitors is a function of the spacing of the electrodes and the dielectric constant of the dielectric. Correspondingly, the dielectric material may have a particularly high or particularly low dielectric constant, and the thickness of the dielectric layer may be set to a predefined value, for example, via thinning.

In one specific embodiment, the capacitor is electrically connected as part of a duplexer circuit. In the duplexer, in addition to the previously described capacitor, additional capacitors may be obtained having a similar construction. It is also possible for all capacitors of the duplexer to be constructed as described above.

The capacitor may in particular be electrically connected in an antenna matching circuit of the duplexer, for example, as a capacitive element of a π circuit having two inductive elements and the capacitive series element between them.

The antenna matching circuit may constitute a phase shifter in the duplexer circuit. Furthermore, the entire phase shifter may be designed in an IPD (integrated passive device) technology and thus implemented in a space-saving manner in the duplexer.

The duplexer may be a hybrid duplexer including BAW resonators in the Tx signal path and including SAW resonators in the Rx signal path.

It is furthermore possible that the thickness of the dielectric layer in the area of the first and the second electrode is set in such a way that a virtual resonance frequency is shifted to higher or lower frequencies by more than the duplexer spacing. The virtual resonance frequency is that frequency which would be the acoustic resonance frequency of the capacitor if the dielectric layer were piezoelectric.

The capacitor is described in greater detail below based on exemplary embodiments, which are to be understood as nonrestrictive, and associated schematic figures.

FIG. 1 shows the essential arrangement of a first, second, and third electrode, FIG. 2 shows the arrangement of the electrodes in a layer stack, FIG. 3 shows the use of the capacitor in a BAW resonator stack, FIG. 4 shows one specific embodiment in which the dielectric layer has a different thickness in different partial capacitors, FIG. 5 shows one specific embodiment in which the terminal electrodes are electrically connected by means of vias, FIG. 6 shows the equivalent circuit diagram of the capacitor, FIG. 7 shows one specific embodiment in which the capacitor is electrically connected in parallel with a BAW resonator, FIG. 8 shows the equivalent circuit diagram of the electrode structure shown in FIG. 7, FIG. 9 shows one specific embodiment of a parallel connection of the capacitor to a BAW resonator having three terminals, FIG. 10 shows the equivalent circuit diagram of the electrode structure of FIG. 9, FIG. 11 shows one specific embodiment in which one of the electrodes is the extension of a lower electrode of a BAW resonator, FIG. 12 shows the equivalent circuit diagram of the specific embodiment of FIG. 11, FIG. 13 shows one specific embodiment of the capacitor having six partial capacitors, FIG. 14 shows the equivalent circuit diagram of a series connection of the capacitor to a resonator, FIG. 15 shows one specific embodiment of the capacitor in which the second electrode is arranged beneath a bump connection, FIG. 16 shows the equivalent circuit diagram of a filter circuit in which the capacitor is electrically connected in parallel with a resonator, FIG. 17 shows the equivalent circuit diagram of a filter circuit in which the capacitor is electrically connected in a rejection circuit, FIG. 18 shows the equivalent circuit diagram of a filter in which the capacitor is electrically connected in parallel with an inductive element L2 and in parallel with a resonator X, FIG. 19 shows the equivalent circuit diagram of a duplexer circuit in which the capacitor is electrically connected in a π-element, FIG. 20 shows the equivalent circuit diagram of a duplexer in which the capacitor is electrically connected in a T-element, FIG. 21 shows a filter circuit with the capacitor as a series branch element, FIG. 22 shows a filter circuit in which the capacitor is electrically coupled to a resonator which is arranged at any location, FIG. 23 shows a duplexer circuit including the capacitor in a matching circuit.

FIG. 1 schematically depicts the arrangement of the three electrodes of the capacitor. A first electrode E1 and a second electrode E2 are structured in a first electrically conductive layer EL1. A third electrode E3 is structured in a second electrically conductive layer EL2. A dielectric layer DL is arranged between the first electrically conductive layer EL1 and the second electrically conductive layer EL2. At least a portion of the first electrode E1 overlaps with a portion of the third electrode E3. At least a portion of the second electrode E2 likewise overlaps with an additional portion of the third electrode E3. The overlap area of the first electrode E1 and the third electrode E3 essentially forms a plate capacitor, symbolized by the capacitive element C1. The overlap area of the second electrode E2 with the corresponding area of the third electrode E3 likewise forms a plate capacitor, symbolized/depicted by the capacitive element C2. The capacitor of FIG. 1 is thus essentially a series connection of two partial capacitors. The electrodes E1, E2 are the terminal electrodes of the capacitor, via which the capacitor may be electrically connected to a circuit environment. Correspondingly, the first electrode E1 constitutes a first terminal T1, while the second electrode E2 constitutes a second terminal T2. The capacitor thus provides a total capacitance which is a function of the partial capacitances C1, C2, which it is possible to access without a via through the dielectric layer DL.

The material or the materials of the dielectric layer DL and the materials of the electrodes may be selected in such a way that the capacitor has sufficiently good electrical properties even at critical frequencies.

FIG. 2 shows one specific embodiment of the capacitor in which the dielectric layer DL and the third electrode E3 are part of a mirror MIR of a BAW resonator of the mirror type. The mirror MIR is arranged on a substrate SU. The depiction of the mirror MIR is symbolic, i.e., the mirror MIR may comprise additional mirror layers having alternately high and low acoustic impedance.

The capacitance of the capacitor is a function of the overlap areas of the electrodes. The overlap area of the electrodes is in particular a function of the electrode area or its shape and diameter w1, w2. By selecting suitable overlap areas, the desired total capacitance of the capacitor may be set, where the following applies: $1/C_{tot}=1/C1+1/C2$. $C_{tot}$ is the total capacitance of the capacitor, while C1 and C2 are the corresponding capacitances of the partial capacitors.

A dielectric material and an additional electrode material which is arranged on it may be present above the first electrically conductive layer EL1 for upper electrodes of the resonator stack.

Thus, the upper nonconductive mirror layer of a BAW resonator may be used as a dielectric for the capacitor. The bottom electrode may comprise multiple single layers. The electrical contacting of the capacitor is carried out via the two electrodes E1, E2 as electric terminals. The materials below the mirror are not dependent on the capacitor and may therefore be arbitrary. For manufacturing reasons, a piezoelectric layer which is possibly present above the first electrically conductive layer EL1 may cover an entire wafer in which the component of the capacitor is manufactured and may have recesses, for example, through-etchings, at only a few locations.

FIG. 3 shows one specific embodiment of the capacitor by way of example, in which a piezoelectric layer PZ is arranged above the first electrically conductive layer EL1 with the electrodes E1, E2. In order to obtain a BAW resonator, an additional upper electrode TE is necessary above an electrode arranged beneath the piezoelectric layer, here, the first electrode E1 as the lower electrode BE. If an HF signal is present at the electrodes TE, BE, a standing acoustic wave may develop in the layer stack. The presence of a piezoelectric layer PZ is necessary for developing the acoustic wave, i.e., for the functional capability of the BAW resonator. However, such a piezoelectric layer as a dielectric in the capacitor would result in undesirable nonlinear effects. This arrangement of the dielectric layers and electrode layers relative to each other thus provides a component in which a BAW resonator may be combined and electrically connected to a capacitor which functions in a highly linear manner.

FIG. 4 shows one specific embodiment of the capacitor in which the spacing of the overlapping electrode areas, i.e., the thickness of the dielectric of the two partial capacitors T1, T2, is chosen differently. The resulting capacitance of a partial capacitor is:

$$C=\epsilon_0\epsilon_r A/D.$$

A is the overlapping area and $\epsilon_r$ is the dielectric constant of the dielectric layer, for example, the upper light-conducting mirror layer. The total capacitance of the partial capacitor may be easily set by setting the distance D. The thickness may be reduced to a thickness d1>d2, in particular in an area of the capacitor, for example, via thinning. Thus, the area-specific capacitance of partial capacitors may be increased at least locally.

FIG. 5 shows one specific embodiment of a capacitor in a BAW component, the electrodes E1, E2 having been made accessible using vias through a piezoelectric layer PZ for connecting to additional circuit components. The terminals T1, T2 to the capacitor are thus provided via the metallizations ME in the vias VIA.

The vias VIA through the piezoelectric layer PZ may, for example, be created by etching. It is also possible that the electrodes E1, E2 are created directly by the metallization ME arranged in the vias VIA. The metallizations ME then touch the dielectric layer directly.

A bump connection as shown by way of example, for example, in FIG. 13, may be arranged and electrically connected in the recess of the via.

FIG. 6 shows the equivalent circuit diagram of the capacitor, i.e., a series connection of two partial capacitors between the terminals T1 and T2. The figure thus shows the equivalent circuit diagram of the capacitor from FIG. 5.

FIG. 7 shows one specific embodiment of the capacitor in which the first electrode E1 is simultaneously the lower electrode of an additional layer stack comprising a dielectric material D2 and a metallization of the terminal T2. If the additional dielectric material D2 is piezoelectric, the first electrode E1 is simultaneously the lower electrode of the corresponding BAW resonator stack. The electrode arrangement of FIG. 7 shows a parallel connection of the capacitor to a resonator comprising the dielectric layer D2. FIG. 7 thus depicts a space-saving specific embodiment of a parallel connection of a capacitor to a resonator. Such an electrode arrangement in particular makes possible the targeted reduction of the resonator coupling of the BAW resonator BAW.

Such an arrangement makes it possible to save chip area, because the partial capacitor comprising the electrodes E1 and E3 is arranged directly beneath the resonator BAW. The space beneath the resonator BAW is in fact generally not available for additional BAW resonator stacks because these areas are acoustically coupled to each other.

It is possible that the area of the second electrode E2 exceeds the required area of the terminal T2 by a factor x. x may lie between 1 and 100 and may be in particular 1.1, 2, 5, 10, and 50.

Figure 1:
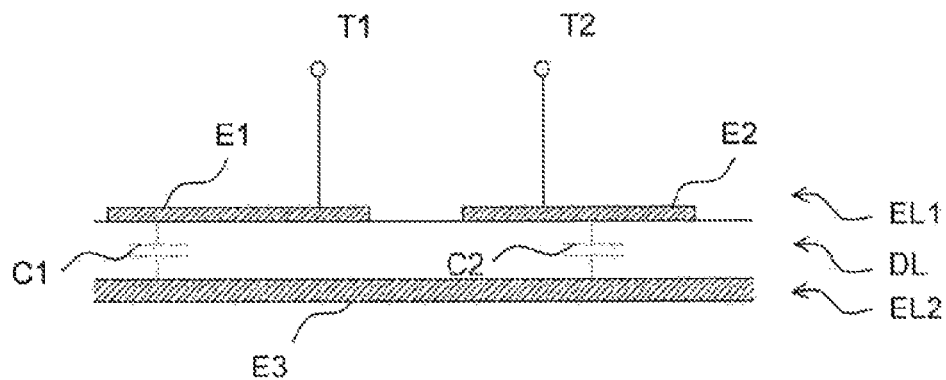
Figure 2:
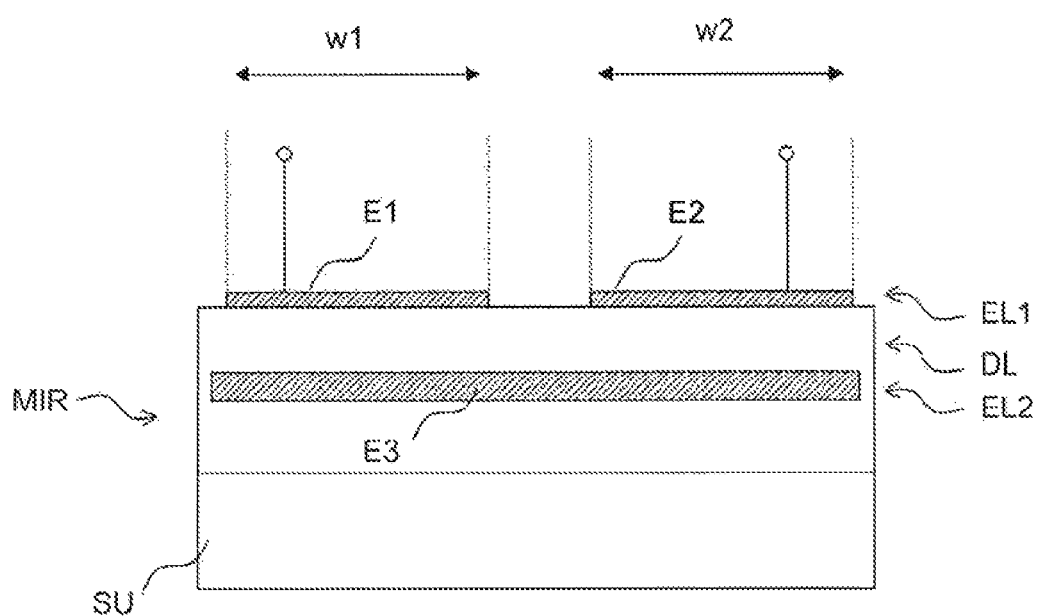
Figure 3:
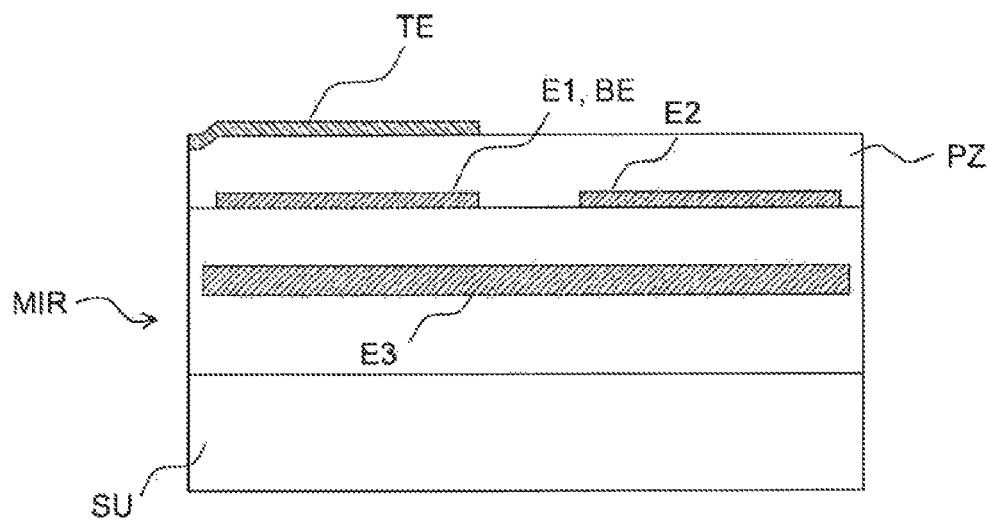
Figure 4:
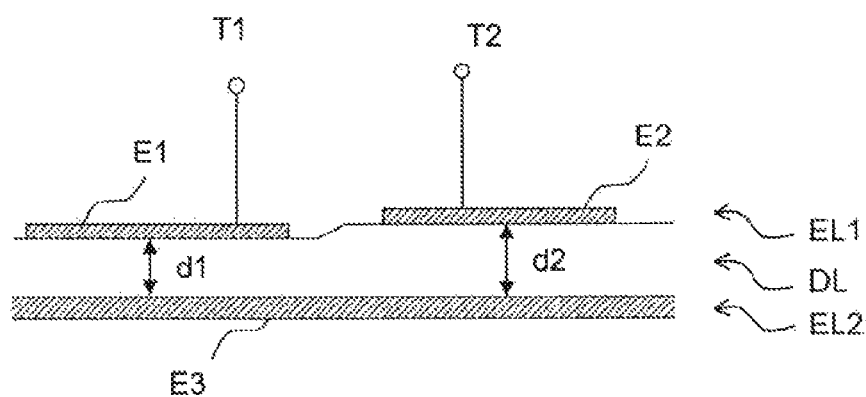
Figure 5:
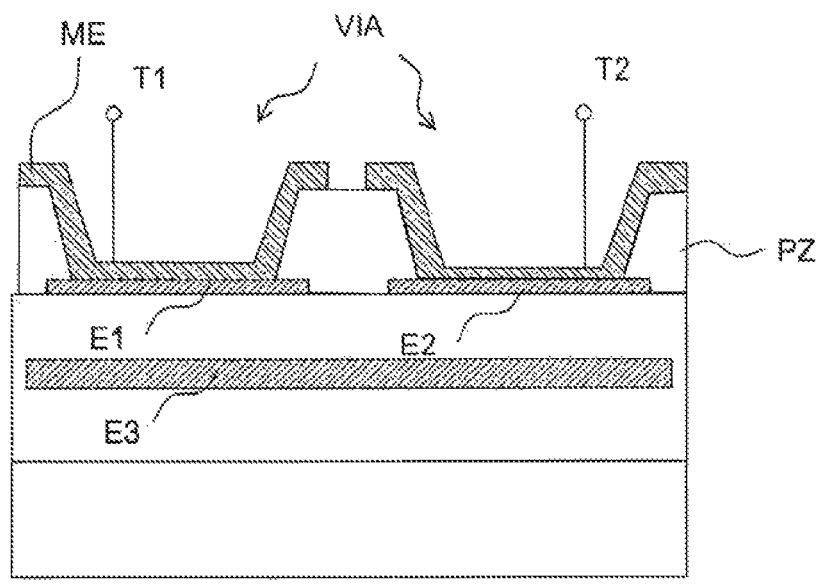
Figure 6:
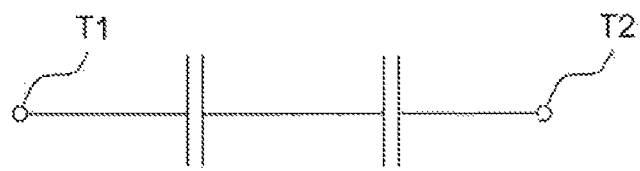
Figure 7:
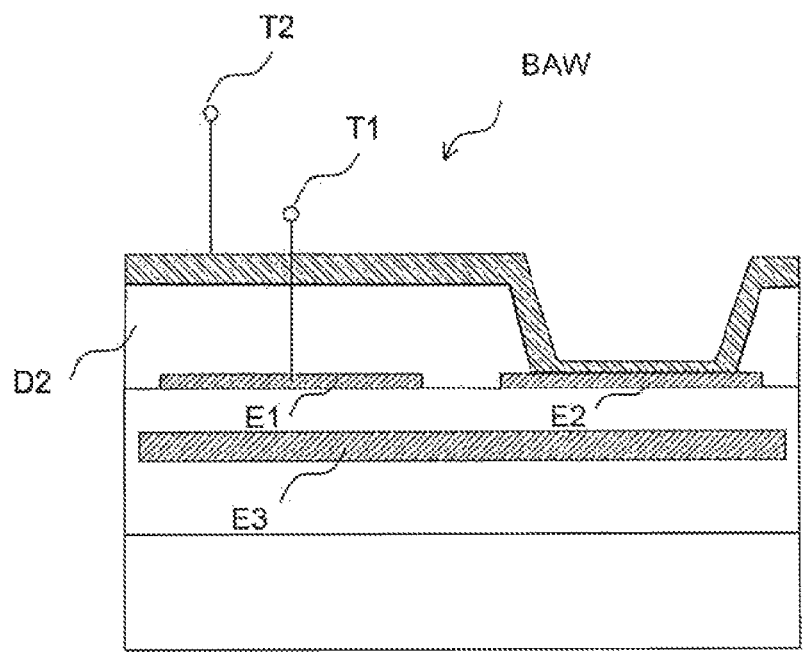
Figure 8:
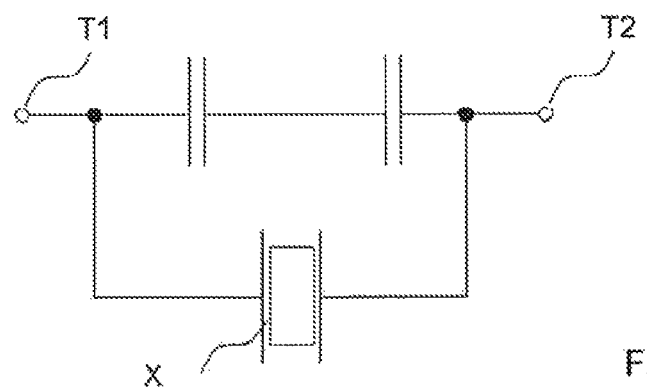
FIG. 8 shows the equivalent circuit diagram of the electrode structure from FIG. 7.
Figure 9:
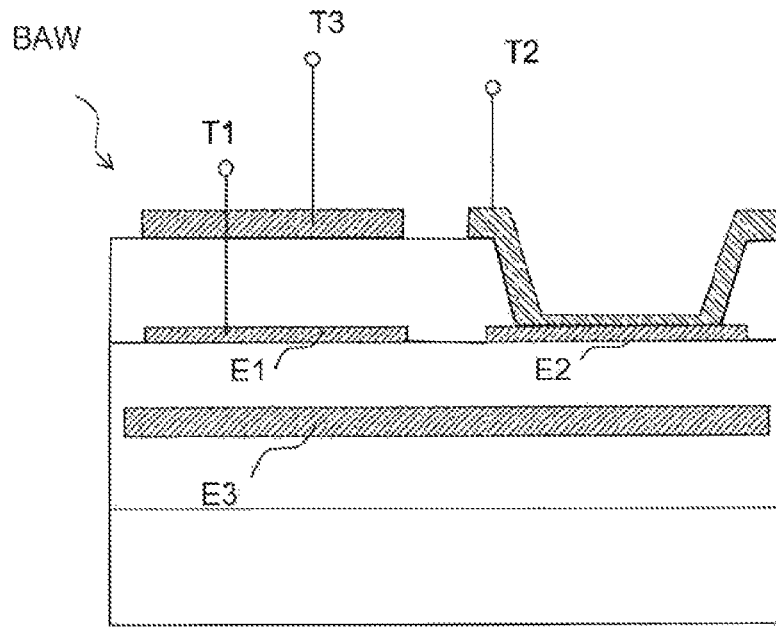
FIG. 9 shows one specific embodiment in which, unlike the specific embodiment of FIG. 7, the second electrode E2 of the capacitor is not electrically connected to the upper electrode of the BAW resonator BAW. The specific embodiment of FIG. 9 thus constitutes a component having three independent terminals T1, T2, T3.
Figure 10:
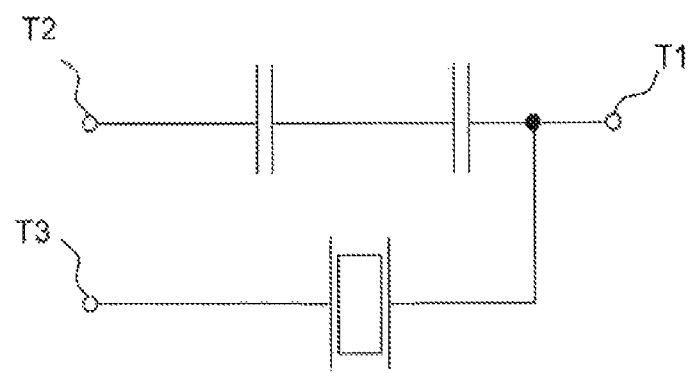

FIG. 10 shows the equivalent circuit diagram of the electrode arrangement of FIG. 9.

Figure 11:
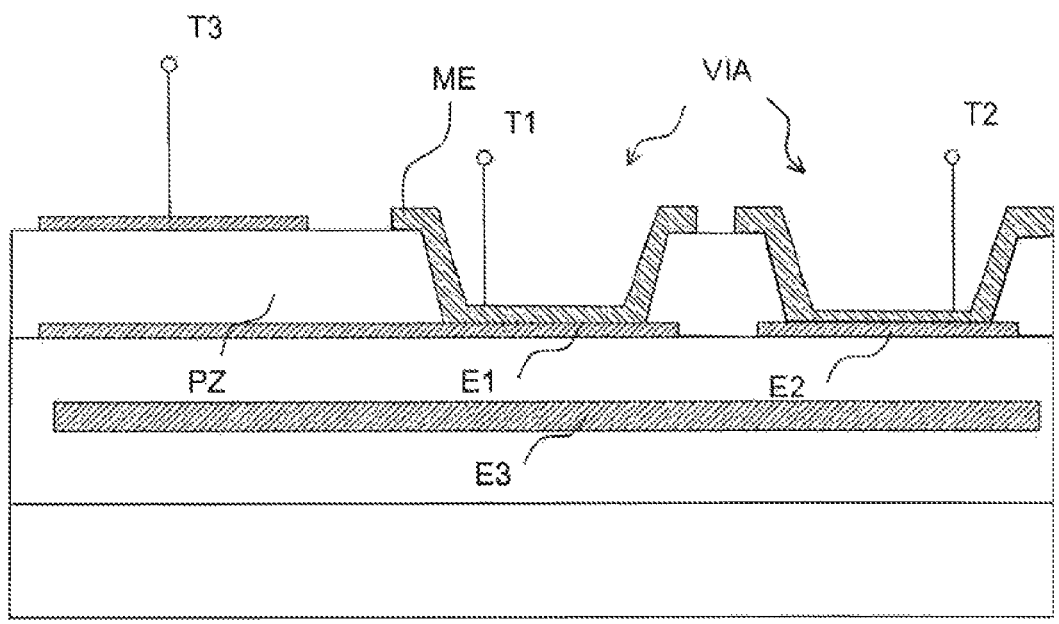

FIG. 11 shows one specific embodiment in which the first electrode E1 of the capacitor is obtained as an extension of the lower electrode of a BAW resonator. The BAW resonator comprises a part of the electrically conductive layer including the first electrode E1, material of the piezoelectric layer, and material of an electrode layer on the piezoelectric layer.

Figure 12:
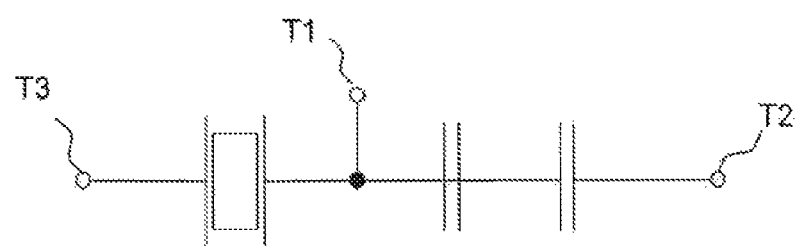

FIG. 12 shows the equivalent circuit diagram of the electrode arrangement of FIG. 11. A terminal T3 is electrically connected to the resonator, but not directly to the capacitor. A terminal T2 is electrically connected to the capacitor, but not directly to the resonator. A terminal T1 is electrically connected directly both to the resonator and the capacitor.

Figure 13:
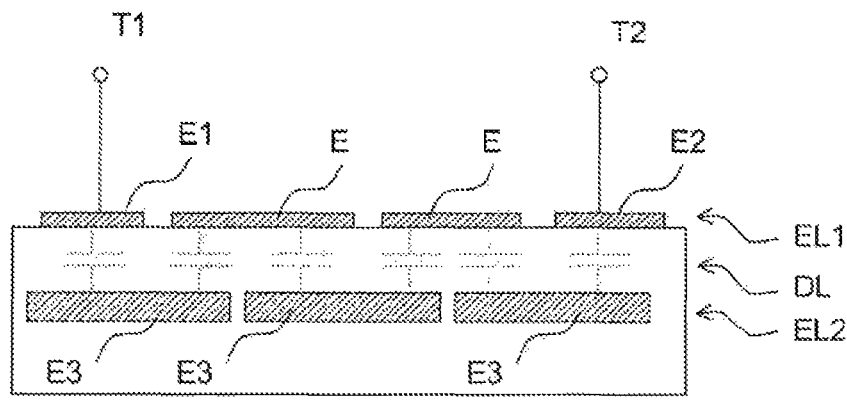

FIG. 13 shows one specific embodiment of the capacitor by way of example including six partial capacitors. In addition to the first electrode E1 and the second electrode E2, the first electrically conductive layer EL1 comprises additional electrode structures E. The second electrically conductive layer EL2 correspondingly comprises additional structured electrode sections, so that a corresponding series connection is obtained from six partial capacitors. In this way, a series connection made up of 2n partial capacitors may be easily obtained, where n is a natural number >1.

Figure 14:
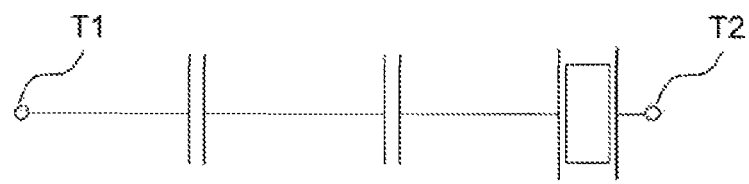

FIG. 14 shows the equivalent circuit diagram of a possible connection of the capacitor, i.e., a series connection, to a resonator.

Figure 15:
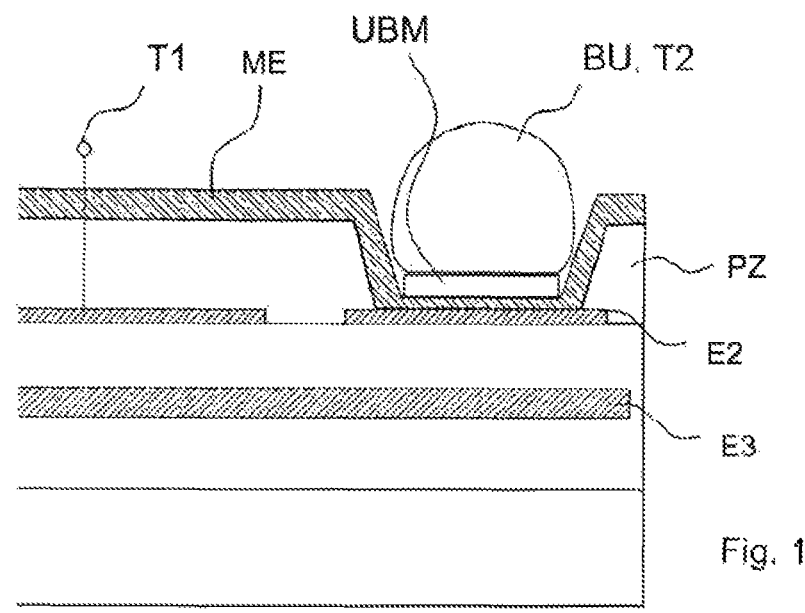

FIG. 15 shows one specific embodiment of a capacitor, in which the contacting of the second electrode is implemented via a bump connection BU. The bump connection BU constitutes the second terminal of the capacitor. The bump connection BU may sit directly on the second electrode. It is also possible for the bump connection BU to be arranged on a metallization ME in a recess through the piezoelectric layer PZ. An additional layer, for example, a so-called UBM (under-bump metallization) may be arranged between the bump connection BU and the first electrode E1 or the metallization ME for improving contact between the bump BU and the electrode.

The implementation of the bump connection BU may be carried out via a piece of a bonding wire, via solder, or other conventional manufacturing methods. Since a bump connection advantageously includes a bottom structure, it is recommended to situate one of the electrodes E1, E2 under the bump connection and to move the corresponding section of the uppermost conductive mirror layer under the bump connection as a third electrode E3, in order to obtain a maximum overlapping structure and thus maximum capacitance of the capacitor.

The third electrode E3 comprises an area which is arranged under the bump connection.

Figure 16:
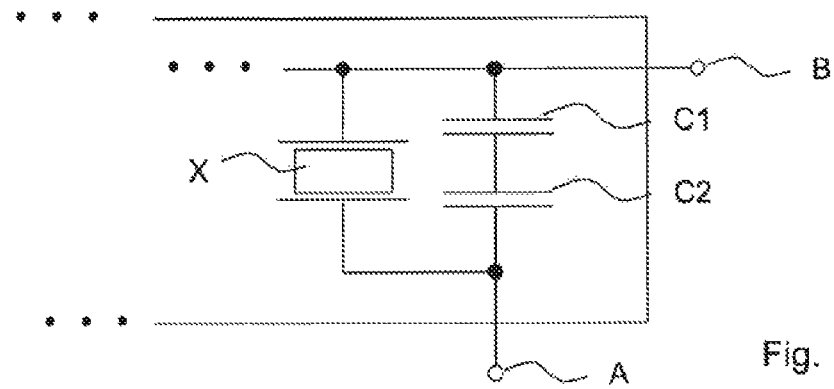

FIG. 16 shows an equivalent circuit diagram of a filter circuit F in which a capacitor comprising the two partial capacitors C1, C2 electrically connected in series is electrically connected in parallel with a resonator X as a parallel branch element, for example, in a ladder-type filter structure. The capacitor may thus connect a terminal B which is, for example, electrically connected to a signal path, to a terminal A which is, for example, electrically connected to ground.

An inductive element L for connecting to ground may also be electrically connected between the terminal A and a ground terminal. The direct connection to the resonator X is not necessary. The capacitor may also connect the terminal B directly to the terminal A without additional circuit elements. More than one capacitor according to the present invention may be included in a filter circuit F and in a corresponding component; the dots on the left FIG. 16 correspondingly indicate that the depicted circuit elements constitute only a portion of a more extensive circuit.

Figure 17:
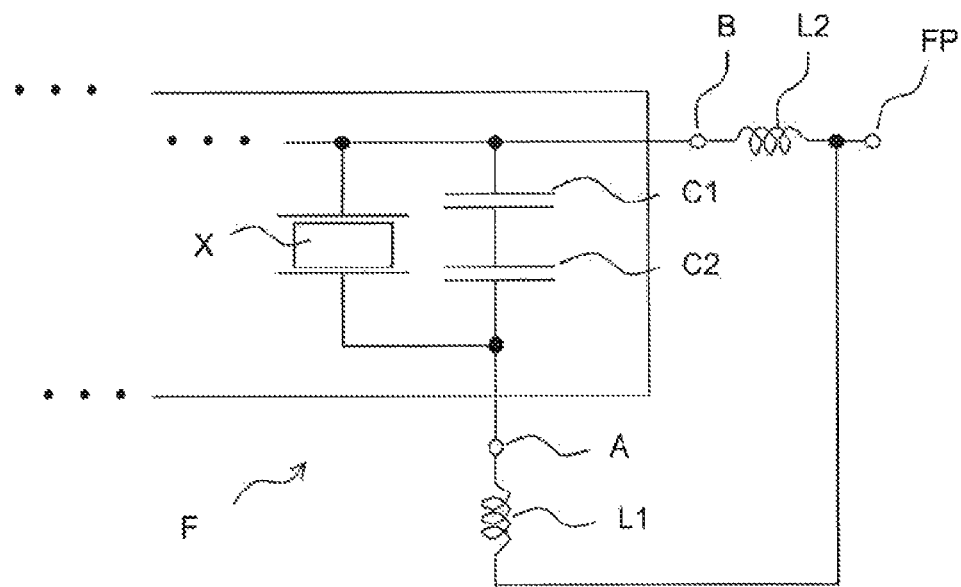

FIG. 17 shows a capacitor including the partial capacitors C1 and C2 which is electrically connected in a rejection circuit. The capacitor is electrically connected to the inductive elements L1 and L2. In particular, the capacitor is electrically connected in series between the two inductive elements L1, L2. FIG. 17 depicts the capacitor as part of a rejection circuit, for example, at a filter port FP. The resonance frequency f of the rejection circuit is $$f = \frac{1}{2\pi\sqrt{(L_1 + L_2)(C_{ges} + C_s)}}.$$

$C_x$ is the static capacitance of the resonator X, and $C_{tot}$ is $1/(1/C_1+1/C_2)$. The inductive elements L1, L2 are optional and may be omitted as required or implemented as parasitic inductances, for example, of feed lines. The parallel connection to the resonator X is optional. Without the connection to the resonator X, a correspondingly corrected blocking frequency results.

Figure 18:
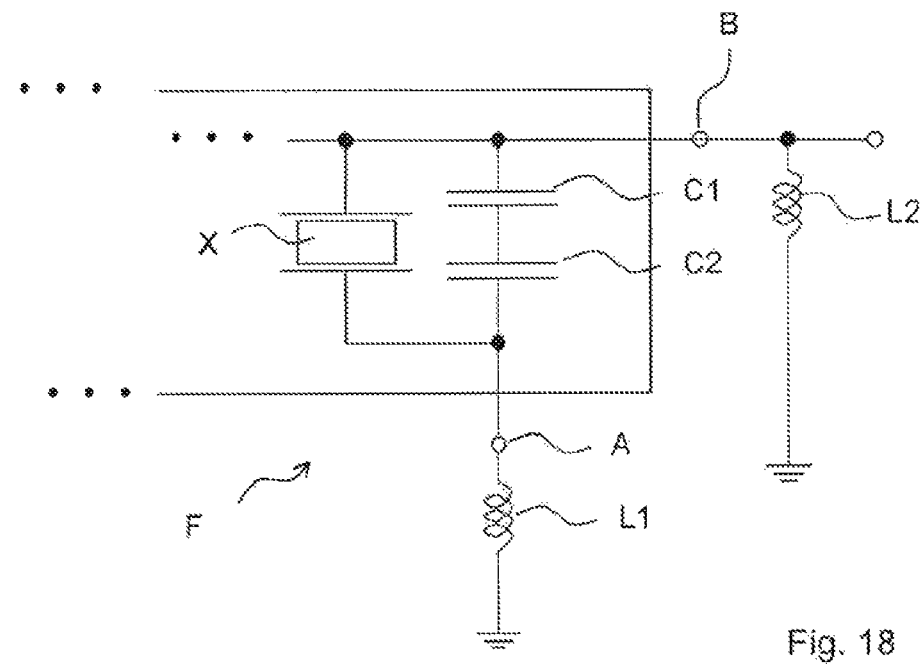

FIG. 18 shows the equivalent circuit diagram of a filter circuit F, the capacitor including the partial capacitors C1, C2 being electrically connected in parallel with an inductive element L2. The inductive element L2 may be part of an impedance matching circuit between the filter circuit F, for example, a transmission or reception filter, and an additional filter, for example, a corresponding reception or transmission filter of a duplexer. When matching impedance using parallel inductive elements and a filter port, small inductance values cause long lines in the Smith chart. Due to the lack of space in the corresponding component, it is usually not possible to introduce an inductive element having a higher inductance in a corresponding housing. There are also application cases in which a serial inductance for compensation is not possible. The capacitor having good linear properties then provides relief if it is electrically connected in parallel with the corresponding inductive element L2. The specific embodiment of FIG. 18 depicts yet another inductive element L1 which, however, is optional and may be omitted, or which may be implemented via a parasitic inductance, for example, a feed line. The connection of the capacitor to the resonator X is also optional and is not mandatory.

Figure 19:
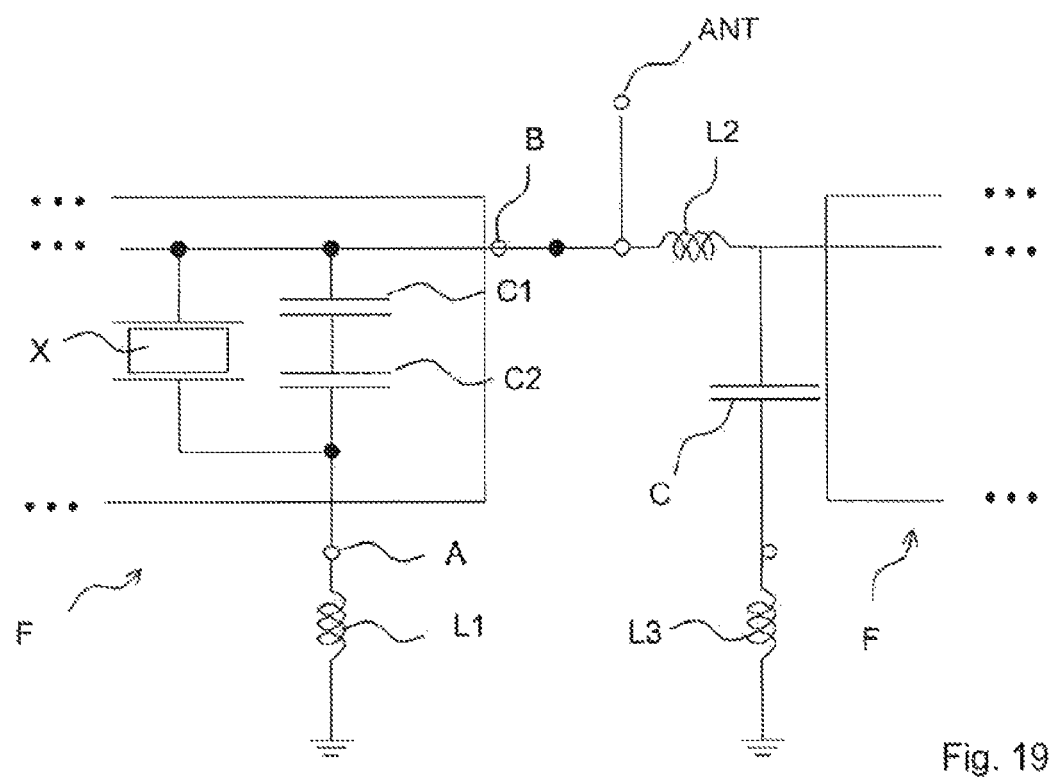

FIG. 19 shows the equivalent circuit diagram of a duplexer circuit including two filter circuits F. The capacitor including the partial capacitors C1 and C2 is part of a π-element circuit, for example, for impedance matching in the antenna port of the duplexer. More precisely, the capacitor is electrically connected in a parallel path of the π-element. An additional capacitive element C is electrically connected in the other parallel path of the π-element. The additional capacitive element C may also be a capacitive element according to the present invention or a conventionally manufactured capacitive element.

Figure 20:
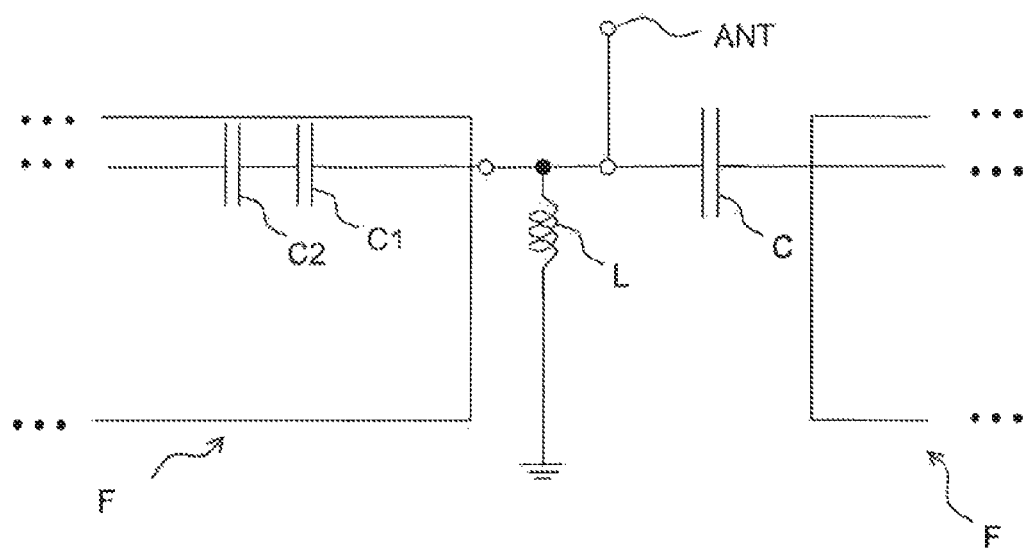

FIG. 20 shows the equivalent circuit diagram of a duplexer circuit including two filter circuits F, the capacitor including the partial capacitors C1, C2 being electrically connected in the series path of a T-element matching circuit. An inductive element L is electrically connected in the parallel branch of the T-element. The inductive element according to the present invention is electrically connected in series with a capacitive element C which is conventional or which is also according to the present invention.

Figure 21:
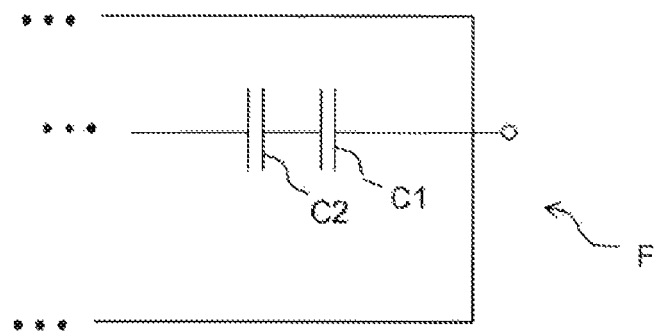

FIG. 21 depicts a general equivalent circuit diagram in which the capacitor is electrically connected as a series branch element to any arbitrary additional circuit components.

Figure 22:
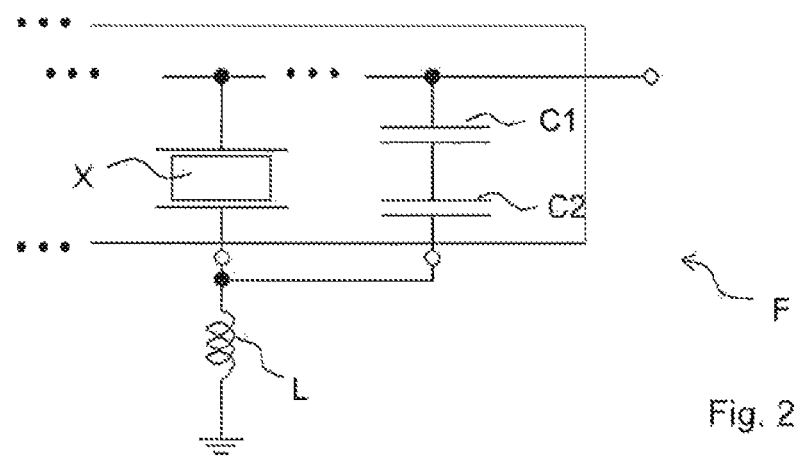

FIG. 22 symbolizes a circuit arrangement in which the capacitor including the partial capacitors C1, C2 is coupled directly or indirectly to a resonator which is arranged at any location. A spatial proximity between the capacitor and the resonator is not mandatory in order to achieve the advantages of the capacitor. The parallel circuit made up of the resonator and the capacitor may be electrically connected to ground via an inductive element L.

Figure 23:
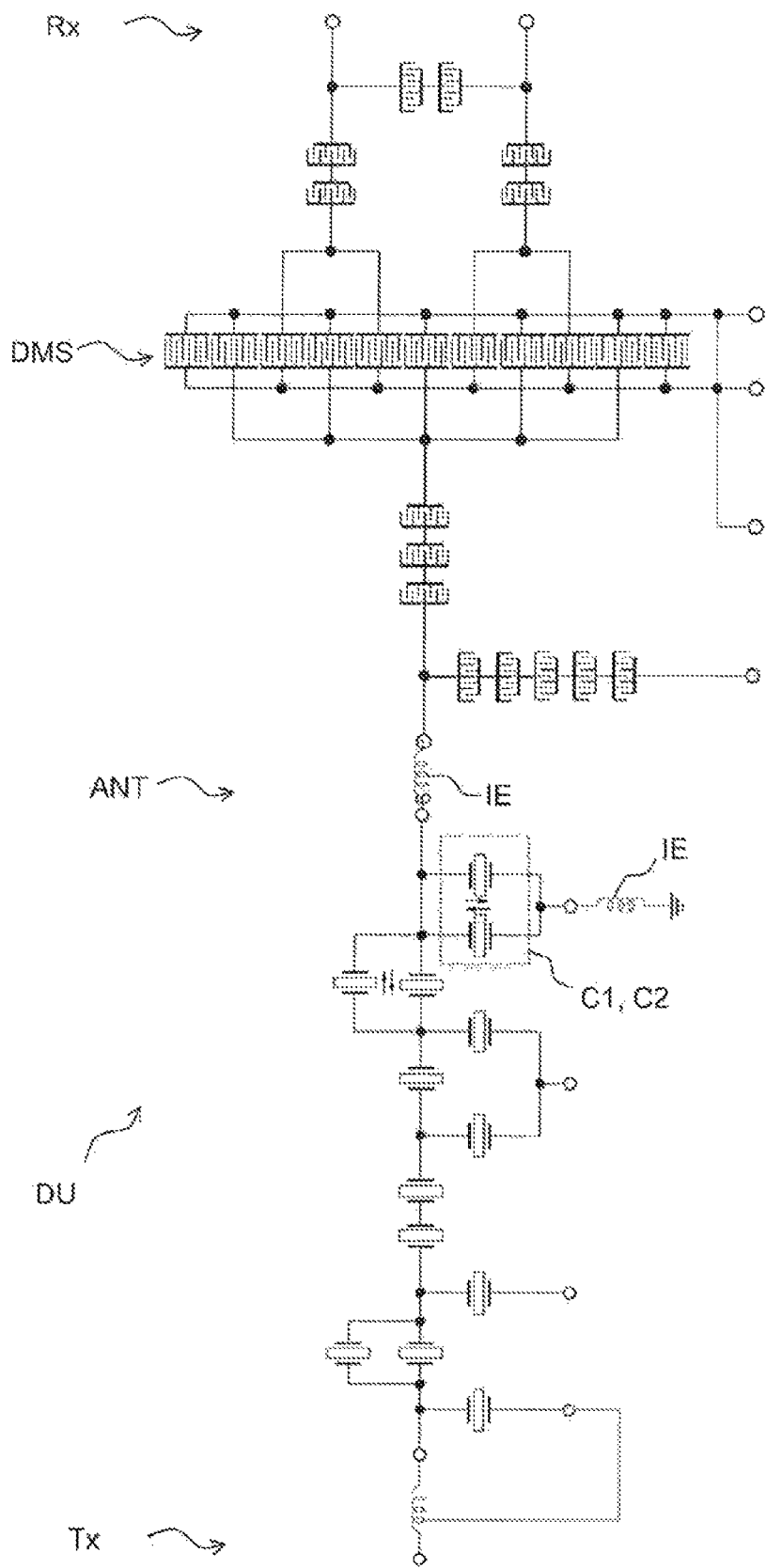

FIG. 23 depicts a duplexer circuit DU having an antenna terminal ANT between a transmission terminal Tx and a reception terminal Rx. A matching circuit including two inductive elements IE and the capacitor including the two partial capacitors C1, C2 is electrically connected to the antenna terminal ANT.

The transmission signal branch functions essentially using bulk acoustic waves, while the reception branch functions using acoustic surface waves. FIG. 23 thus constitutes a hybrid duplexer. A ground element of a ladder-type structure having a triple cascade in the signal path and quadruple cascade in the parallel branch path is electrically connected between the antenna terminal ANT and the reception terminal Rx. A DMS (dual mode SAW) structure is electrically connected between the ground element and the terminal Rx. The reception terminal Rx is balanced. The transmission terminal is unbalanced.

A capacitor according to the present invention is not limited to one of the described exemplary embodiments. Combinations of features of the exemplary embodiments and variations which, for example, comprise additional resonators, inductive or capacitive elements, or partial capacitors, also constitute exemplary embodiments according to the present invention.

LIST OF REFERENCE NUMBERS

A, B: Filter terminals
ANT: Antenna terminal
BAW: BAW resonator stack, BAW resonator
BE: Lower electrode of a BAW resonator stack
BU: Bump connection
C: Capacitive element
C1, C2: First, second partial capacitor
D1, D2: Thicknesses of the dielectric layer
D2: Additional dielectric material
DL: Dielectric layer
DMS: DMS structure
DU: Duplexer
E: Additional structured electrodes in the first electrically conductive layer
E1, E2: First, second electrode
E3: Third electrode
EL1: First electrically conductive layer
EL2: Second electrically conductive layer
F: Filter
f: Blocking frequency
IE: Inductive element
L1, L2: Inductive element
ME: Metallization
MIR: Mirror
PZ: Piezoelectric layer
Rx: Reception terminal
SU: Substrate
T1, T2: First, second terminal of the capacitor
TE: Upper electrode of a BAW resonator stack
Tx: Transmission terminal
UBM: Under-bump metallization
VIA: Via
W1, W2: Lateral dimensions of the first, second electrode
X: Resonator

The invention claimed is:

1. An apparatus comprising:
    a bulk acoustic wave (BAW) resonator stack comprising a first electrode, a second upper electrode, a lower electrode, and a piezoelectric layer disposed between the first upper electrode and the lower electrode;
    a mirror structure disposed below the lower electrode of the BAW resonator stack and comprising a dielectric layer, wherein the dielectric layer is not piezoelectric; and
    a capacitor electrically connected to the BAW resonator stack and comprising:
        first and second electrically conductive layers, wherein the dielectric layer of the mirror structure is disposed between the first and second electrically conductive layers;
        a first electrode and a second electrode disposed in the first electrically conductive layer; and
        a third electrode disposed in the second electrically conductive layer, wherein:
            a portion of the first electrode and a portion of the second electrode each overlap with at least a portion of the third electrode;
            the first electrode and the second electrode are terminal electrodes of the capacitor;
            the first electrode and the lower electrode are the same electrode; and
            the second electrode of the capacitor is connected to the second upper electrode through the piezoelectric layer.

2. The apparatus of claim 1, wherein the second upper electrode is electrically connected to the second electrode by a via through the piezoelectric layer, such that the second upper electrode and the lower electrode of the BAW resonator stack are the terminal electrodes of the capacitor.

3. The apparatus of claim 1, wherein the first upper electrode is electrically disconnected from the second electrode and wherein the first upper electrode, the first electrode, and the second electrode comprise at least three terminal electrodes for the apparatus.

4. The apparatus of claim 3, wherein the first upper electrode and the first electrode have a same length.

5. The apparatus of claim 2, wherein the second electrode of the capacitor is electrically connected to a high frequency (HF) filter circuit by the via through the piezoelectric layer.

6. The apparatus of claim 2, wherein the second electrode is electrically connected to a bump connection disposed above a metallization for the via through the piezoelectric layer.

7. The apparatus of claim 1, wherein the dielectric layer is locally thinned in an area associated with the first electrode or with the second electrode.

8. A high frequency (HF) filter circuit comprising the apparatus of claim 1.

9. The HF filter circuit of claim 8, further comprising a rejection circuit or an absorption circuit, wherein the rejection circuit or the absorption circuit comprises the apparatus of claim 1.

10. The HF filter circuit of claim 8, further comprising an inductive element electrically connected in parallel with the capacitor of claim 1.

11. A duplexer matching circuit including a pi-element or a T-element, wherein the duplexer matching circuit comprises the apparatus of claim 1.

12. A duplexer circuit comprising the apparatus of claim 1.

* * * * *